United States Patent [19]

Spychalski

[11] Patent Number: 4,689,578
[45] Date of Patent: Aug. 25, 1987

[54] HYDROPHONE PRE-AMPLIFIER WITH SELF-CALIBRATION

[75] Inventor: Stephen E. Spychalski, Gulfport, Miss.

[73] Assignee: The United States of America as represented by the Secretary of the Navy, Washington, D.C.

[21] Appl. No.: 845,675

[22] Filed: Mar. 28, 1986

[51] Int. Cl.[4] ............................................. H03F 3/45
[52] U.S. Cl. ..................................... 330/2; 330/260; 330/295; 330/305; 330/306; 330/308; 367/13
[58] Field of Search ....................... 330/2, 59, 69, 253, 330/254, 260, 306, 305, 308, 252, 295; 367/13

[56] References Cited

U.S. PATENT DOCUMENTS 3,260,947 11/1963 Dorsman ................................ 330/17
3,757,288 9/1973 Morin ................................... 163/299
4,166,270 8/1979 Brastins et al. ..................... 872/473
4,213,099 7/1980 Brown ................................ 330/2 X
4,241,428 12/1980 Berni et al. ........................... 330/258
4,242,741 12/1980 Parrish ................................. 367/21
4,276,619 6/1981 Rickenbacker ....................... 367/13

Primary Examiner—James B. Mullins
Attorney, Agent, or Firm—Thomas M. Phillips

[57] ABSTRACT

A differential charge amplifier design for a hydrophone pre-amplifier includes a calibration circuit for in situ measurement of the hydrophone/pre-amplifier gain. The hydrophone signal is input to a pair of amplifier stages which form a balanced differential input charge amplifier. The signal from the input charge amplifier is amplified by a second pre-amplifier stage and then passed to a balanced output cable driver. The calibration circuit is enabled by an external signal to inject a calibration signal into the input charge amplifier front end.

10 Claims, 5 Drawing Figures

HYDROPHONE PRE-AMPLIFIER WITH SELF-CALIBRATION

BACKGROUND OF THE INVENTION

1. Field of the Invention

The present invention relates to pre-amplifier systems, and more particularly to an improved hydrophone pre-amplifier with self-calibration using differential charge amplifiers.

2. Description of the Prior Art

To develop definitive models of the deep ocean floor and subbottoms, which models are used to predict the performance of marine systems which acoustically interact with the bottom, a deep-towed measurement system using a low-frequency sound source and multichannel array system as shown in FIG. 1 is required. The low-frequency sound source, together with a digital telemetry system capable of driving a long coaxial tow cable and compatible with downlink power transmission, is mounted on a deep-towed vehicle, or fish. Behind the fish a hydrophone array is streamed. The hydrophone array, as shown in FIG. 2, has a plurality of alternating active sections and interconnect sections. The active sections each contain a plurality of hydrophones. The interconnect sections contain interconnect wiring, a pre-amplifier for each hydrophone in the downstream active section, a depth sensor and a heading sensor. The data acquired is transmitted by the telemetry system on the fish via the tow cable to a towing vessel for data processing.

A charge amplifier design, a simplified circuit of which is shown in FIG. 3, is used for the pre-amplifiers so that the hydrophone signal is not attenuated by the cable capacitance between the hydrophone and the pre-amplifier. Also, the hydrophone/pre-amplifier signal gain is equal to the ratio of the charge amplifier feedback capacitor, $C_f$, and the hydrophone capacitance, $C_H$. One disadvantage, however, is that a change in hydrophone capacitance due to depth causes a change in the overall system gain by as much as 10 dB from near surface to 6000 m.

SUMMARY OF THE INVENTION

Accordingly, the present invention provides a differential charge amplifier design for a hydrophone pre-amplifier which includes a calibration circuit for in situ measurement of the hydrophone/pre-amplifier gain. The hydrophone signal is input to a pair of amplifier stages which form a balanced differential input charge amplifier. The signal from the input charge amplifier is amplified by a second pre-amplifier stage and then passed to a balanced output cable driver. The calibration circuit is enabled by an external signal to inject a calibration signal into the input charge amplifier front end.

Therefore, it is an object of the present invention to provide a hydrophone pre-amplifier for use in deep ocean water.

Another object of the present invention is to provide a hydrophone pre-amplifier which can be calibrated in situ.

Other objects, advantages and novel features of the present invention will be apparent from the following detailed description when read in connection with the appended claims and attached drawing.

DESCRIPTION OF THE PREFERRED EMBODIMENT

Figure 1:
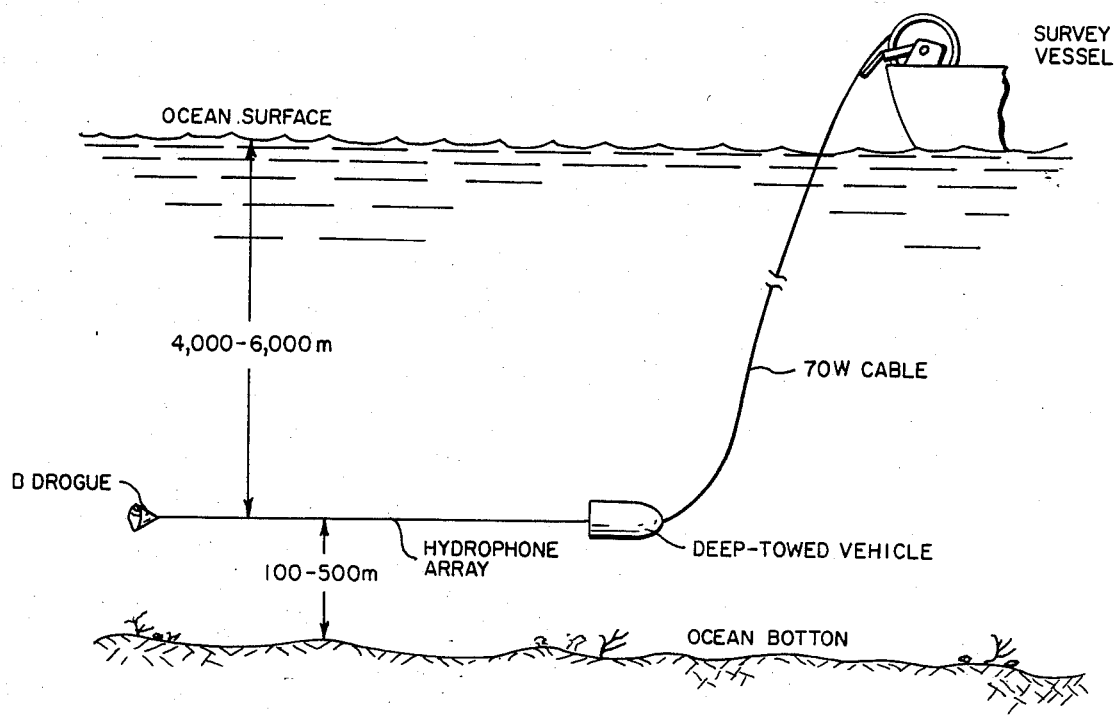
FIG. 1 is a diagrammatic view of a deep-towed array geophysical measurement system.
Figure 2:
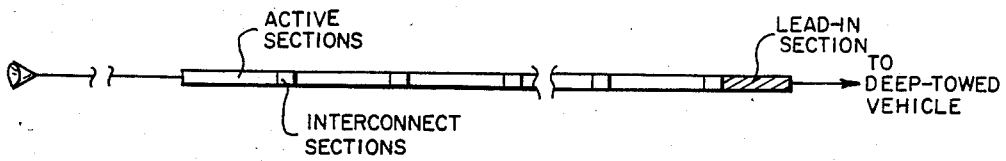
FIG. 2 is a diagrammatic view of a hydrophone array for the deep-towed array geophysical measurement system.
Figure 3:
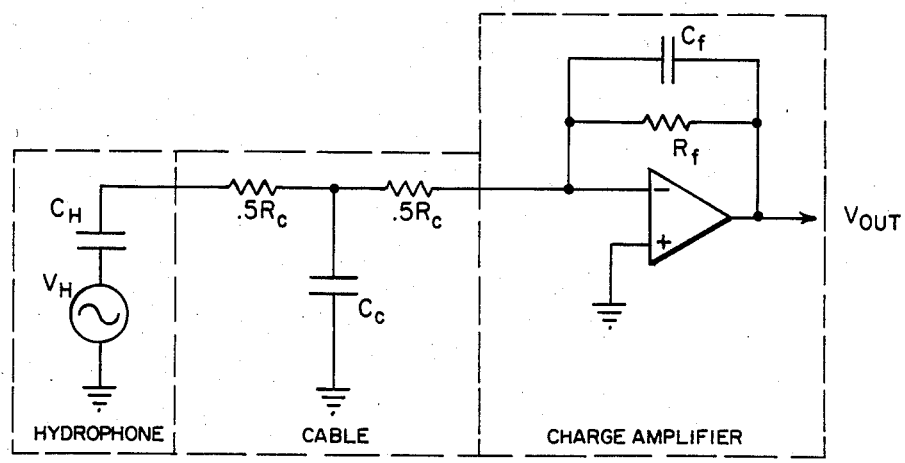
FIG. 3 is a simplified circuit diagram for a charge amplifier.
Figure 4:
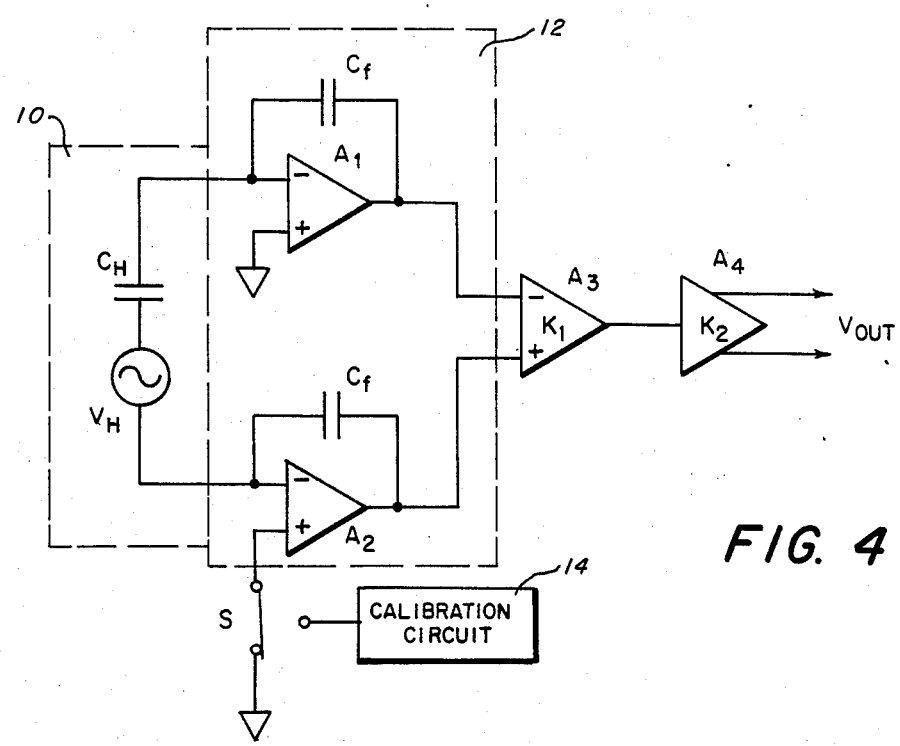
FIG. 4 is a block diagram of the hydrophone pre-amplifier according to the present invention.

Referring now to FIG. 4 the signal from a hydrophone 10 is input to the pre-amplifier, the hydrophone being represented by the equivalent circuit of $C_H$ and $V_H$. Two amplifier stages $A_1$ and $A_2$ form a balanced differential input charge amplifier 12 to which the hydrophone signal is input. The signal from the charge amplifier 12 is input to a second pre-amplifier stage $A_3$ for additional signal gain. The signal is then passed to a balanced output cable driver $A_4$. Supply voltages for the pre-amplifier are generated from a hybrid DC/DC converter, not shown, so that each pre-amplifier has its own power supply to minimize power supply/ground coupling of signals from channel to channel in the array. A calibration circuit 14, which is enabled by an external command, injects an oscillator signal into the front end of one stage $A_2$ of the charge amplifier 12 via an electronic switch S.

Figure 5:
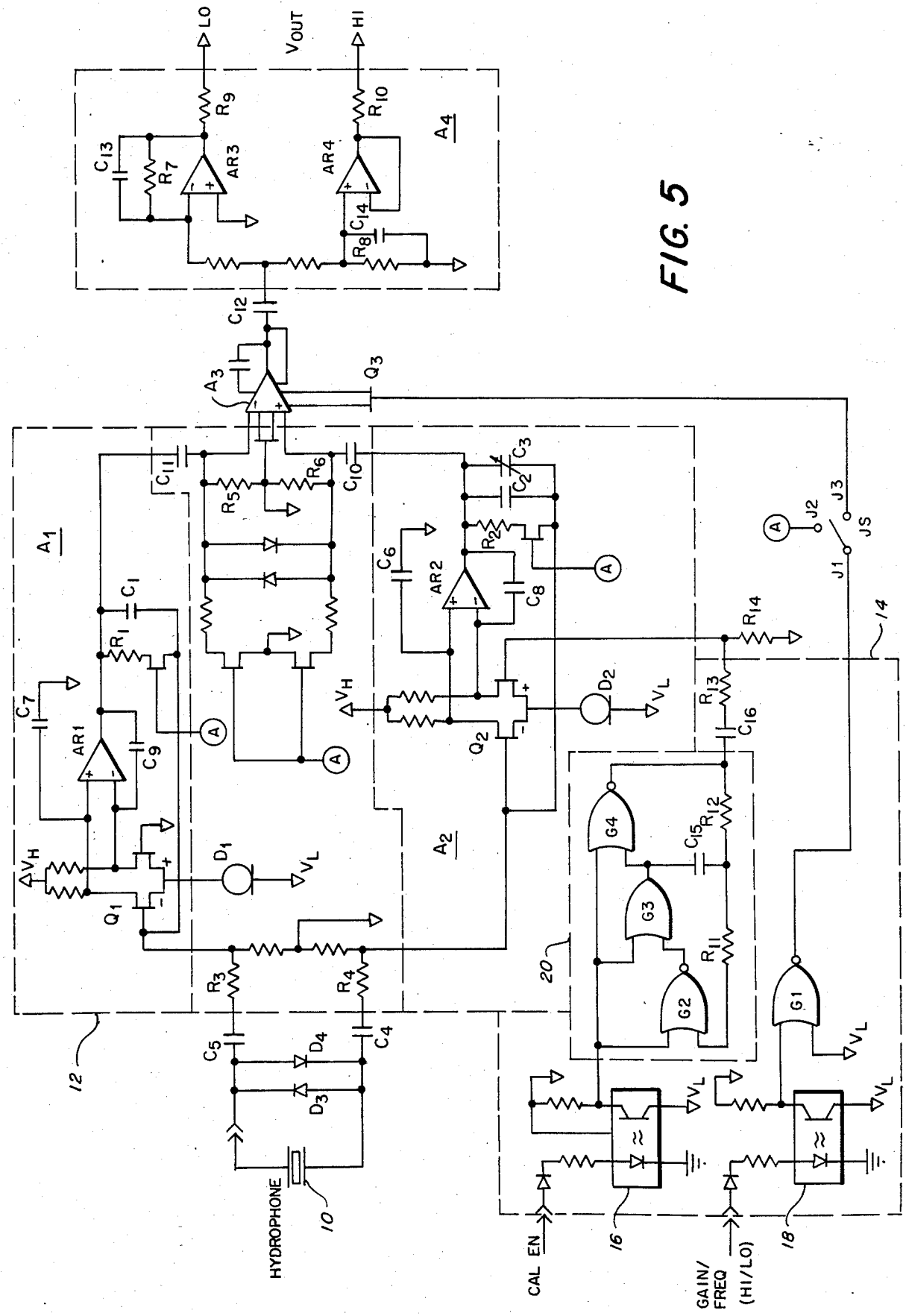
FIG. 5 is a schematic diagram of the hydrophone pre-amplifier of FIG. 4.

As shown in FIG. 5 the balanced input charge amplifier 12 is formed by amplifier stages $A_1$ and $A_2$. Each stage has a low noise matched FET pair $Q_1$ and $Q_2$ in cascade with an operational amplifier AR1 and AR2, respectively. Gain is set by feedback capacitors $C_1$ and $C_2$, gain being the ratio of hydrophone capacitance to feedback capacitance in the charge amplifier configuration, and fine tuned by trim capacitor $C_3$ to optimize the pre-amplifier common mode rejection ratio. Feedback resistors $R_1$ and $R_2$ form a first order high pass filter for low frequency rejection in the first stage. Current regulator diodes $D_1$ and $D_2$ set the input FET operating point and the equivalent input noise level. Diodes $D_3$ and $D_4$ and resistors $R_3$ and $R_4$ protect the input amplifiers $A_1$ and $A_2$ from overload, and capacitors $C_4$ and $C_5$ stabilize or match amplifier 12 halves for common mode gain characteristics. Capacitors $C_6$, $C_7$, $C_8$ and $C_9$ are used for first stage amplifier compensation.

The signal from the balanced input charge amplifier 12 is passed to an instrumentation amplifier $A_3$ through a second first order high pass filter composed of capacitors $C_{10}$ and $C_{11}$ and resistors $R_5$ and $R_6$ where a minimum gain is applied. A higher gain may be selected by an external control line GAIN/FREQ (HI/LO). An FET gain switch $Q_3$ is activated by Gain/FREQ (HI/LO) when the jumper of switch JS is from J1 to J3. When the jumper of switch JS is from J1 to J2, the GAIN/FREQ (HI/LO) control line is connected via FET switches to resistors $R_1$, $R_2$, $R_5$ and $R_6$ to change the time constants of the respective first and second stage first order high pass filters. Thus, either the gain or the frequency of the first order high pass filters can be controlled by external command.

The output of the second stage $A_3$ is a.c. coupled via capacitor $C_{12}$ to a balanced output line driver $A_4$. A first order low pass filter is formed by capacitor/resistor pairs $R_7/C_{13}$ and $R_8/C_{14}$. The output stages $AR_3$ and $AR_4$ are protected from output disturbances, such as short circuits to sea water, system supplies via sea water and the like, by output resistors $R_9$ and $R_{10}$.

The external control signals, such as GAIN/FREQ (HI/LO) and CAL EN, are passed to the pre-amplifier by optically coupled isolators 16 and 18. Gate G1 passes the GAIN/FREQ (HI/LO) from one of the optical isolators 18 to the FET switch $Q_3$ or the first order high pass filter FETs.

A square wave oscillator 20 is formed by three gates G2, G3, and G4 and a feedback network made up of resistors $R_{11}$ and $R_{12}$ and capacitor $C_{15}$. The frequency of the oscillator is approximately equal to 0.46 divided by $R_{12}$ times $C_{15}$ with $R_{11}$ equal to $R_{12}$. The oscillator 20 for each pre-amplifier is set to a different frequency for channel identification. The output of the oscillator 20 is a.c. coupled by capacitor $C_{16}$ to a resistor voltage divider $R_{13}$ and $R_{14}$. The attenuated signal from the oscillator 20 is injected into the non-inverting input of one stage $Q_2$ of the charge amplifier 12 for an in situ gain check of the combined hydrophone/preamplifier system. The oscillator 20 is enabled by the CAL EN command via the optical isolator 16. The gain of the calibration system, from the oscillator attenuator output, equals $1+(C_C+C_C)/C_f$ where $C_C$ is the cable capacitance, $C_H$ is the hydrophone capacitance and $C_f$ is the feedback capacitance of $C_1$, $C_2$ and $C_3$.

In operation the deep-towed array geophysical measurement system is deployed in deep ocean from the survey vessel. Upon reaching operational depth the CAL EN command from the survey vessel is transmitted to the pre-amplifiers in the interconnect sections of the hydrophone array. The known oscillator signals are injected into the charge amplifier first stage and the overall system gain is determined for each pre-amplifier. A GAIN/FREQ (HI/LO) command determines the gain of the second stage $A_3$ or the operational frequency of the first order high pass filters, depending upon the jumper in switch JS. Once the system is calibrated, data may be acquired and processed by the system. A second calibration may be made after a data run to assure no significant system change. The result is more accurate data acquisition for determining the geophysical characteristics of the deep ocean bottom.

Thus, the present invention provides an improved hydrophone pre-amplifier having the ability to be calibrated in situ in the deep ocean.

What is claimed is:

1. A pre-amplifier comprising:
    a balanced input differential charge amplifier to amplify an input signal;
    means for amplifying the output signal from said balanced input differential charge amplifier;
    a balanced output line driver to output the signal from said amplifying means; and
    means for calibrating said pre-amplifier in situ upon receipt of an external command by injecting an oscillator signal into the front end of said balanced input differential charge amplifier.

2. A pre-amplifier as recited in claim 1 wherein said calibrating means comprises:
    an electronic switch to turn on said oscillator signal upon receipt of a calibrate enable command; and
    a square wave oscillator to generate said oscillator signal when said calibrate enable command is received.

3. A pre-amplifier is recited in claim 2 further comprising means for attenuating said oscillator signal prior to injecting said oscillator signal into the front end of said balanced input differential charge amplifier.

4. A pre-amplifier as recited in claim 3 further comprising means for electrically isolating said external command from said pre-amplifier via an optical coupler.

5. A pre-amplifier as recited in claim 4 wherein said balance input differential charge amplifier comprises:
    two parallel stages to amplify said input signal, each of said parallel stages having a low noise matched FET pair in cascade with an operational amplifier, said operational amplifier having capacitor feedback and a first order high pass filter coupled between said operational amplifier and said low noise matched FET;
    means between the source of said input signal and said parallel stages for protecting said parallel stages from overloads; and
    means connected to said low noise matched FET pairs for setting the input FET operating point and equivalent input noise level.

6. A pre-amplifier as recited in claim 5 wherein said amplifying means comprises:
    a second first order high pass filter though which the output signal from said balanced input differential charge amplifier is passed; and
    a differential amplifier connected to the output of said second first order high pass filter to amplify the filtered output signal from said balanced input differential charge amplifier.

7. A pre-amplifier as recited in claim 6 wherein said balanced output line driver comprises:
    a low output amplifier having a first order low pass filter;
    a high output amplifier having a first order low pass filter; and
    means connected to the outputs of said low and high output amplifiers for protecting said low and high output amplifiers from output disturbances.

8. A pre-amplifier as recited in claim 7 wherein said calibration signal is injected into the non-inverting input of one of said low noise matched FET pairs.

9. A pre-amplifier as recited in claim 8 further comprising means for switching the gain of said amplifying means upon an external gain/frequency command between a low and a high gain.

10. A pre-amplifier as recited in claim 8 further comprising means for selecting the frequency of operation of said first order high pass filters between a low frequency operation and a high frequency operation by changing the time constants of said first order high pass filters upon receipt of an external gain/frequency command.

* * * * *